Figure 1:
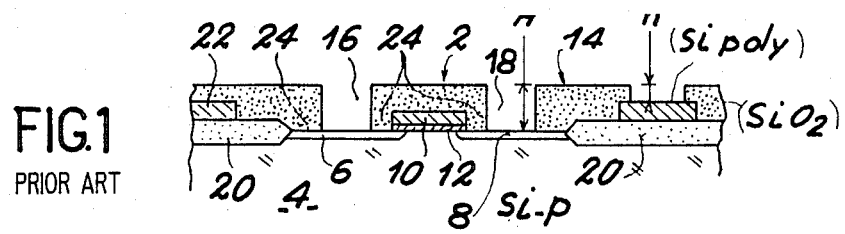

United States Patent [19]

Jeuch

[11] Patent Number: 4,728,620

[45] Date of Patent: Mar. 1, 1988

[54] PROCESS FOR THE PRODUCTION OF A MIS-TYPE INTEGRATED CIRCUIT

[75] Inventor: Pierre Jeuch, Seyssins, France

[73] Assignee: Commissariat a l'Energie Atomique, Paris, France

[21] Appl. No.: 857,752

[22] PCT Filed: Jul. 29, 1985

[86] PCT No.: PCT/FR85/00208

§ 371 Date: Mar. 18, 1986

§ 102(e) Date: Mar. 18, 1986

[87] PCT Pub. No.: WO86/01336

PCT Pub. Date: Feb. 27, 1986

[30] Foreign Application Priority Data

Aug. 3, 1984 [FR] France .................................. 84 12300

[51] Int. Cl.⁴ ........................................... H01L 21/425
[52] U.S. Cl. ...................................... 437/41; 437/200; 437/228
[58] Field of Search ...................... 29/571, 576 B, 578, 29/576 W; 148/187

[56] References Cited

U.S. PATENT DOCUMENTS

| 4,038,110 | 7/1977 | Feng | 29/576 W |
|---|---|---|---|
| 4,135,954 | 1/1979 | Chang et al. | 148/187 |
| 4,358,891 | 11/1982 | Roesner | 29/571 |
| 4,359,816 | 11/1982 | Abbas et al. | 29/571 |
| 4,419,813 | 12/1983 | Iwai | 29/576 W |
| 4,444,605 | 4/1984 | Slawinski | 148/187 |
| 4,506,434 | 3/1985 | Ogawa et al. | 29/576 W |
| 4,560,421 | 12/1985 | Maeda et al. | 29/571 X |

Primary Examiner—George T. Ozaki
Attorney, Agent, or Firm—Oblon, Fisher, Spivak, McClelland & Maier

[57] ABSTRACT

A process for the production of a MIS-type integrated circuit is disclosed. In order to form an integrated circuit having reciprocally electrically insulated active components in which the gates of the components do not extend above the electrical insulations used for the reciprocal insulation of the components, the process consists of covering a semiconductor substrate (30) with a first layer (32) of insulating material, depositing on the first layer (32) of insulating material a second layer including a semiconductor or conductor material in which will be formed the gates (34a) of the active components, formulation of the field oxide (46a) of the circuit used for electrically insulating the active components from one another, production of the gates (34a) of the active components, production of the sources and drains of the components by a doping of the substrate, the doping having a reverse conductivity to that of the substrate (3), formation of insulating edges (58a) on the edges of the gates (34a) of the components, production of electrical contact holes of the circuit, and production of connections of the circuit.

49 Claims, 23 Drawing Figures

PROCESS FOR THE PRODUCTION OF A MIS-TYPE INTEGRATED CIRCUIT

The present invention relates to a process for the production of a MIS-type integrated circuit (metal-insulator semiconductor) and more particularly of the MOS or CMOS type. It more particularly applies in the field of electronics and information processing to the production of logic gates, flip-flops, read-only or read-/write memories, etc.

Integrated circuits and more particularly MOS or CMOS circuits are fundamentally formed from n and-/or p channel transistors, which are electrically interconnected. In integrated circuits, there are several conductor layers located at different levels ensuring the interconnection of the transistors of these circuits. The formation of these different connection levels makes it necessary to have a very planar circuit structure.

The stages of the processes for the production of integrated circuits used for obtaining relatively planar structures are generally known as planarization stages.

Unfortunately the use of such a technology in existing integrated circuit production processes leads to serious difficulties during contacting of sources and drains of the transistors forming these circuits. This disadvantage is illustrated by the attached FIG. 1, which is a diagrammatic longitudinal section of part of a prior art MOS integrated circuit.

FIG. 1 shows a MOS-type transistor 2, produced on a semiconductor substrate 4, particularly of monocrystalline silicon. Transistor 2 has a source 6 and a drain 8, produced by ion implantation in substrate 4, as well as a gate 10, generally made from polycrystalline silicon, surmounting a gate oxide 12 positioned above substrate 4 between source 6 and drain 8. The active zone of said transistor 2 is surmounted by an insulating layer 14, generally made from silicon dioxide and serving inter-alia to insulate gate 10 from the source 6 and drain 8 of said transistor. In said insulating layer 14 are formed electrical contact holes 16, 18, respectively, permitting the electrical contacting with the transistor source 6 and drain 8.

This transistor 2 is electrically insulated from the other components and particularly the other transistors constituting the integrated circuit by silicon dioxide zones 20, which are partly buried in the substrate and constituting what is called the field oxide of the circuit. On said field oxide is generally produced a first interconnection level 22 permitting the interconnection of part of the transistors of the integrated circuit. The oxide layer 14, in which are formed the contact holes 16 and 18 of the source and drain also permits an electrical insulation between the first interconnection level 22 of the integrated circuit and the following level.

In order to ensure a good electrical insulation between the first interconnection level 22 and the next level, it is necessary for the insulating layer 14 to have, between said first interconnection level and the next level, a minimum height h, which is typically approximately 0.7 $\mu$m. Bearing in mind the thickness of the field oxide 20 (close to 0.5 $\mu$m) and the first interconnection line 22, said minimum height h leads to the production of the electrical contact holes such as 16 and 18 with a relatively large depth H, which is typically approximately 1.4 $\mu$m.

The production of relatively deep electrical contact holes causes numerous problems with regard to the contacting of sources and drains, such as the appearance of cracks or breaks in the conductive layer deposited within the contact holes serving to interconnect the sources and/or drains of the transistors and as a result the transistors and integrated circuits produced are defective.

As has been stated hereinbefore, the surface of the integrated circuits must be made as planar as possible during each stage of their production, so as to facilitate the production of the different connections of said circuits.

Figure 2:
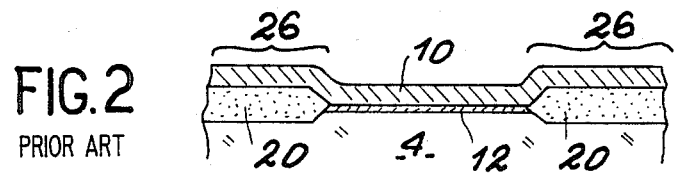

However, one of the factors prejudicial to the planarity of the integrated circuits is the overlapping of the field oxide thereof by the gate electrode of the components or transistors of said circuits. This is illustrated by FIG. 2 showing, in cross-section, part of the integrated circuit of FIG. 1. In the latter, the overlap zones of the gate 10 of the MOS transistor on field oxide 20 carry the reference 26.

Apart from these problems and bearing in mind the evolution of integrated circuits and their increasing significance for producing circuits in electronics and/or information processing, increasing efforts are being made to reproduce the dimensions of the components forming them and particularly transistors, i.e., for increasing the integration density of said circuits.

However, one of the factors limiting the integration density of integrated circuits is the production of the electrical contact holes such as 16 and 18 in the insulating material layer 14 (FIG. 1). Thus, the correct positioning of these contact holes facing the source region 6 and drain region 8 formed in said substrate 4 makes it necessary to provide insulation protectors such as 24 in insulating layer 14.

The present invention is directed at the production of an integrated circuit, particularly of the MOS or CMOS type, which makes it possible to solve the aforementioned problems. It more particularly permits easy contacting of the sources and drains of the transistors of the integrated circuit, while making it possible to produce integrated circuits having a substantially planar structure, while significantly increasing the integration density of these circuits.

The present invention aims at producing an integrated circuit having active components and particularly MOS transistors, which are electrically insulated from one another and whose gates do not extend above the electrical insulations used for insulating said components from one another. This makes it possible to improve the planarity of the integrated circuits and consequently facilitate the production of connections between the different components of said circuits.

More specifically, the present invention relates to a first process for the production, on a semiconductor substrate, of an integrated circuit having reciprocally electrically insulated components in which the gates of said components do not extend above the electrical insulations used for the reciprocal insulation of said components, said process being characterized in that it comprises, in sequence, the following stages:

(a) covering a semiconductor substrate with a layer of a first insulating material, (b) deposition on the layer of the first material a layer of a second semiconductor or conductor material in which will be formed the gates of the active components, (c) formation of the field oxide of the circuit used for electrically insulating the active components from one another, (d) production of the gates of the active components, (e) production of the sources and drains of the components by a doping of the substrate, said doping having a reverse conductivity to that of the substrate, (f) formation of insulating edges on the edges of the gates of the components, and (g) production of electrical contacts and connections of the circuit.

As a result of the sequence of stages, this first process makes it possible to increase the integration density of the integrated circuits and facilitate the production of the different connections of these circuits. Moreover, the different stages of this process are not critical and are easily and reproducibly produced, which is not always the case in the prior art processes. This process can consequently be advantageously used for industrial mass production of integrated circuits and particularly MOS or CMOS circuits.

According to a preferred embodiment of the first process of the invention, the field oxide of the integrated circuit, i.e., the insulation zones is produced by performing, in sequence, the following stages:

(1) definition of the regions of the substrate in which will be produced the active components with the aid of a first positive mask, (2) elimination of the regions of the different material layers surmounting the substrate and free from the first mask, so as to expose certain regions of the substrate, (3) preliminary doping the substrate in the exposed regions thereof, said preliminary doping having the same type of conductivity as that of the substrate, (4) eliminating the first mask, (5) deposition of a layer of a third insulating material on the complete structure obtained, and (6) etching the third material layer, so as to expose the etched material layer located directly below the third material layer.

The term positive mask is understood to mean a mask defining the regions covering it. Negative mask means a mask defining the regions not covering it.

The production of the field oxide of the integrated circuit, as described hereinbefore, greatly contributes to increasing the integration density of said circuit. Moreover, compared with the conventional field oxide production process called LOCOS, it makes it possible to obviate carrying out an irksome, long heat treatment stage, leading to a diffusion into the substrate of the implanted ions necessary for the doping beneath the field oxide.

The present invention also relates to a second process for the production of an integrated circuit, in which the gates of the components do not extend above the electrical insulation used for reciprocally insulating the various components. This second process is characterized in that it comprises, in sequence, the following stages:

(α) producing the field oxide of the circuit used for electrically insulating the active components from one another, (β) covering the substrate with a layer of a first insulating material, (γ) depositing on the complete structure a layer of a semiconductor or conductor material in which will be formed the gates of the active components, (δ) etching the layer of second material so as to expose the field oxide, (ε) producing the gates of the active components, (ζ) producing the sources and drains of the components by a doping of the substrate, said doping having a reverse conductivity to that of the substrate, (η) producing insulating edges on the edges of the gates of the components, and (θ) producing electrical contacts and connections of the circuit.

Like the first, this second process makes it possible to significantly increase the integration density of the integrated circuits and to facilitate the production of the different connections of said circuits.

According to a preferred embodiment of the second process of the invention, the field oxide of the integrated circuit is produced by carrying out, in sequence, the following stages:

carrying out a preliminary doping of the substrate having a conductivity of the same type as that of the substrate, deposition of a layer of a third insulating material on the complete semiconductor substrate, definition of the regions of the substrate in which will be formed the active components with the aid of a first negative mask, elimination of the regions of the layer of the third material free from said first mask, and elimination of the said first negative mask.

Other features and advantages of the invention can be better gathered from the following illustrative and non-limitative description with reference to the attached drawings, wherein show:

FIG. 1 Already described, diagrammatically and in longitudinal section an integrated circuit according to the prior art.

FIG. 2 Already described, diagrammatically and in cross-section part of the integrated circuit of FIG. 1.

Figure 6:
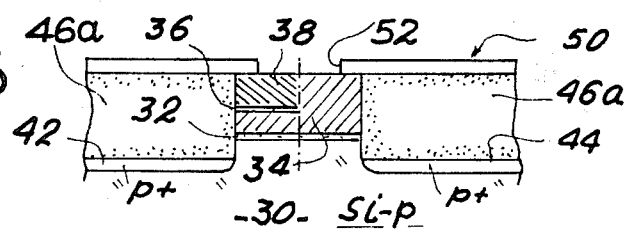
Figure 7:
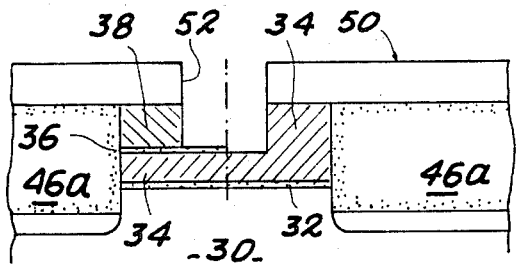
Figure 7A:
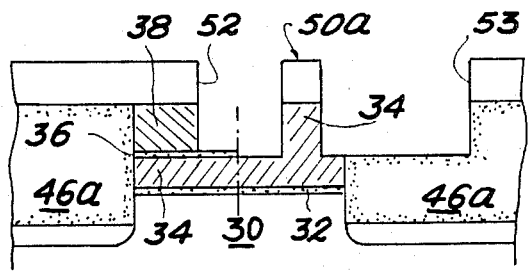
Figure 12:
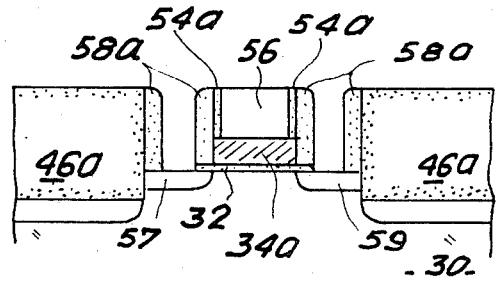
Figure 13:
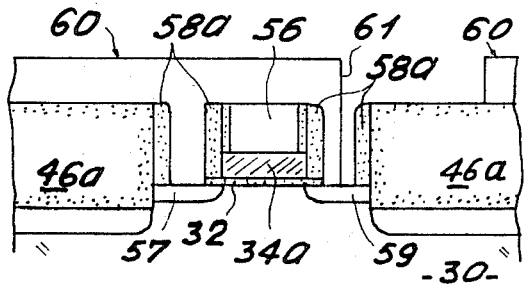
Figure 13A:
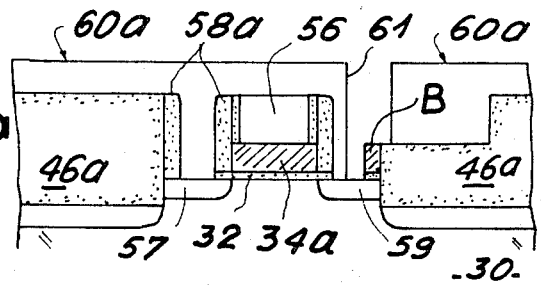

FIGS. 3 to 17 Diagrammatically and in longitudinal section the various stages of the first process for the production of an integrated circuit according to the invention, FIGS. 7a and 13a illustrating variants of said first process.

Figure 18:
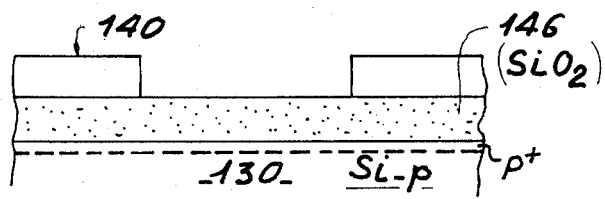
Figure 19:
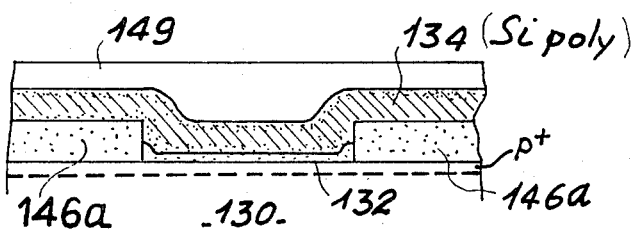
Figure 20:
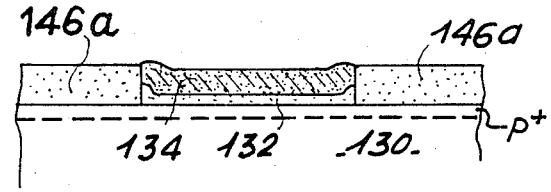

FIGS. 18 to 20 Diagrammatically and in longitudinal section part of the different stages of the second integrated circuit production process according to the invention.

Figure 21:
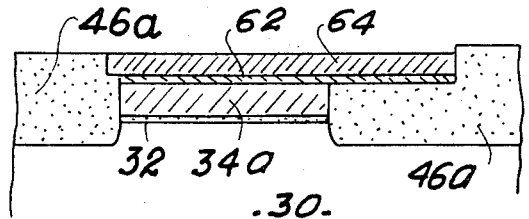

FIG. 21 Diagrammatically and in longitudinal section part of an integrated circuit according to the invention.

The following description relates to the production of a MOS integrated circuit having a single N channel transistor, for the purpose of simplifying said description. However, the invention has a much more general scope, because it applies to any MIS integrated circuit produced on a semiconductor substrate, the latter being a solid substrate or a semiconductor layer surmounting an insulating support.

The transposition of the following description to CMOS technology, essentially involving the supplementary operation of doping and in particular ion implantation is obvious to the expert. The same applies with regards to the production of P channel transistors.

Moreover, certain stages of the process according to the invention, such as cleaning stages, will not be described hereinafter, because they are well known to the expert.

Figure 3:
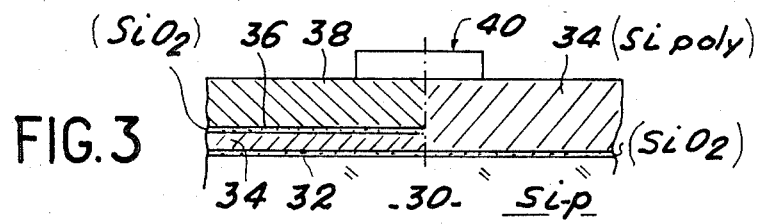

With reference to FIGS. 3 to 17, a description will be given of a first process for the production of an integrated circuit according to the invention. This first process firstly consists, as shown in FIG. 3, of covering a semiconductor substrate 30, particularly of p monocrystalline silicon, with a first layer 32 of an insulating material, which is preferably of silicon dioxide. The first layer 32 in particular has a thickness of 0.025 $\mu$m and can be obtained by thermal oxidation of the silicon substrate 30 at a temperature close to 900° C. This silicon dioxide layer 32 will subsequently form the gate oxide of the N channel MOS transistor to be produced.

Through said silicon dioxide layer 32 is effected a doping of the substrate 30 used for defining the doping beneath the transistor channel, said doping having a conductivity of the same type as that of substrate 30. This doping can be obtained by ion implantation and particularly by implanting boron ions when the substrate is of the p type. This involves a first implantation at a dose of $10^{12}$ atm/cm$^2$ with an energy of 50 keV and a second implantation at a dose of $4 \cdot 10^{11}$ atm/cm$^2$ with an energy of 140 keV.

The following stage of the first process consists of depositing on the first layer 32 of insulating material, a second layer 34 of a conductor or semiconductor material, in which will subsequently be formed the gate of the N channel MOS transistor. Preferably, the second layer 34 is made from polycrystalline silicon, which may or may not be doped with phosphorus, molybdenum, tungsten, tantalum or titanium silicides, or a refractory metal such as molybdenum, tantalum, titanium and tungsten. The deposition of said second layer 34 can be obtained by a chemical vapour phase deposition process (CVD or LPCVD) or by magnetron sputtering.

In a first variant of the first process, shown in the right-hand part of FIG. 3, there is a single conductor or semiconductor layer 34 and it has a thickness of approximately 1.2 $\mu$m.

In another variant, shown in the left-hand part of FIG. 3, said conductor layer 34 only has a thickness of approximately 0.3 $\mu$m and is successively covered with an insulating layer 36, made from an insulating material, preferably silicon dioxide, and a temporary layer 38 made from a conductor or semiconductor material which does not become part of the finished product.

Insulating layer 36, e.g., having a thickness of 0.07 $\mu$m, can be obtained by thermal oxidation of the second layer 34, when the latter is made from polycrystalline silicon or silicides, at a temperature of approximately 900° C. In other cases, layer 36 can be obtained by deposition and particularly by a chemical vapor phase deposition process (CVD or LPCVD). Layer 36 will subsequently serve as the etching barrier layer.

The semiconductor or conductor material temporary layer 38 surmounting the insulating layer 36 can be made, like the second layer 34, particularly from polycrystalline silicon, silicides, molybdenum, tantalum, titanium and tungsten. Temporary layer 38 which has a thickness of 0.6 $\mu$m can be obtained by a chemical vapor phase deposition process (CVD or LPCVD). Temporary layer 38 mainly has a topology function, rather than a physical or electrical function.

The following stages of the first process consist of producing the integrated circuit insulations, mainly constituted by the field oxide of said circuit. Firstly and both in the case of a thick conductive second layer 34 and a stack of layers 34, 36 and 38, using conventional photolithography processes, a resin or positive mask 40 is produced, which serves to define the region of substrate 30 in which will be formed the N channel transistor. This mask is positive, because it masks the region of substrate 30 in which the transistor will be formed. Then, as shown in FIG. 4, the regions of the different layers of the material surmounting the substrate 30 are eliminated, i.e., layers 32 and 34 (first variant on the right-hand side of FIG. 4) or layers 32, 34, 36 and 38 (second variant on the left-hand side of FIG. 4), which are free from mask 40 up to the exposure of the regions of substrate 30 not covered by said mask.

This elimination can be carried out by successive anisotropic etching processes and particularly reactive ion etching processes of the different layers of material surmounting the semiconductor substrate. The insulating layers, particularly of silicon dioxide 32, 36 can be etched with trifluoromethane (CHF$_3$) and the conductive layers 34, 38, when the latter are made from polycrystalline silicon or silicides, by using sulphur hexafluoride (SF$_6$).

Through using different etching agents as a function of whether the layers are insulating (layers 32 and 36) or conductive or semiconductive (layers 34 and 38) makes it possible to use the layer positioned below that which is etched as the etching barrier layer, which makes it possible to compensate the thickness inhomogeneities of these different layers.

Figure 4:
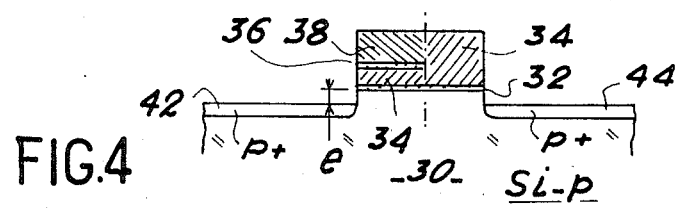

Optionally and as shown in FIG. 4, there is then an etching of the exposed substrate regions over a thickness e, using positive mask 40 as the mask for said etching process. This etching of the substrate will subsequently make it possible to obtain a partly buried field oxide, as in conventional oxide production processes. The thickness of etching e is, e.g., approximately 0.4 $\mu$m. The etching of substrate 30 or more correctly its exposed regions is preferably carried out anisotropically, e.g., using reactive ion etching with sulphur hexafluoride as the etching agent in the case of a silicon substrate.

The following stage in the production of the field oxide according to the invention consists, still using the same resin positive mask 40, carrying out a preliminary doping of substrate 30 or the exposed regions thereof, said preliminary doping having a conductivity of the same type as that of the substrate. This doping can, e.g., be carried out by ion implantation, while more particularly implanting boron ions, in the case of a type p substrate at an energy of 80 keV and a dose of $10^{12}$ atm/cm$^2$. This doping makes it possible to obtain two lateral regions 42 and 44, particularly of type p$^+$. Following said doping, the resin positive mask 40 is eliminated, e.g., by etching with an oxygen plasma.

Figure 5:
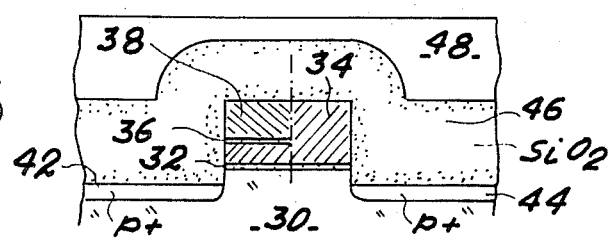

As shown in FIG. 5, this is followed by the deposition on the complete structure of a third layer 46 of an insulating material, e.g., formed from optionally phosphorus-doped silicon dioxide. This insulating third layer 46, e.g., has a thickness of 1.5 $\mu$m. It can be obtained by a low pressure chemical vapor phase deposition process (LPCVD) and preferably with plasma assistance (PECVD). This insulating layer 46 can then advantageously undergo a heat treatment, e.g., at a temperature of 1050° C. for 10 mn, so as to compact layer 46.

The final stage for obtaining the field oxide of the integrated circuit according to the invention consists of etching the more particularly silicon dioxide third layer 46, so as to expose the etched material layer directly below third layer 46.

In the variant shown in the left-hand part of FIG. 5, the etching of the insulating third layer 46 will make it possible to expose the conductor or semiconductor temporary layer 38 and in the variant shown in the right-hand part thereof, the etching of layer 46 will make it possible to expose the thick conductor or semiconductor second layer 34.

Insulating third layer 46 is advantageously etched (in accordance with planarization technology) by depositing in per se known manner on said third layer, a fourth layer 48 of a planation material obliterating the relief of third layer 46. Planation fourth layer 48 is preferably made from resin of the type widely used in photolithography. The deposition of resin fourth layer 48, which more particularly has a thickness of 1.5 μm, can be followed by a heat treatment, e.g., heating at a temperature of approximately 200° C. for 30 minutes, so as to obtain a good spreading of the resin fourth layer 48 and consequently a good planar surface.

This is followed by the simultaneous etching of resin fourth layer 48 and insulating layer 46, which is more particularly of silicon dioxide, at identical etching speeds for the resin and the oxide up to the total elimination of the region of layer 46 (cf. FIG. 6) surmounting either the etched conductor or semiconductor temporary layer 38 (to the left in the drawing) or the etched conductor or semiconductor layer 34 (to the right in the drawing). This etching which leads to the obtaining of a field oxide 46a with a perfectly planar surface is preferably carried out anisotropically, e.g. using a reactive ion etching process with the etching agent being formed by a mixture of trifluoromethane or tetrafluoromethane (CHF$_3$ or CF$_4$) and oxygen; the fluorine-containing compounds being used for etching the silicon dioxide and the oxygen for etching the resin.

The following stages of the first production process for an integrated circuit according to the invention deal with the production of gates of active components of said circuit and in the present case the gate of the N channel MOS transistor.

As shown in FIG. 6, the production of the gate of said transistor firstly consists of defining the dimensions of the gate and the electrical connections of said gate with the aid of a negative mask 50, referred to as the gate negative mask more particularly made from resin placed about the structure. The width of the opening 52 of the negative mask exactly corresponds to that of the gate of the transistor to be produced. Moreover, opening 52 of mask 50 projects beyond the field oxide 46a, so as to be able to effect a connection of said gate. This is shown in FIG. 21, which in cross-section, shows part of an integrated circuit according to the invention. The projection of the conductive layers 62, 64 over the field oxide 46a corresponds to the projection of opening 52 over the field oxide and consequently to the connection of the gate.

In a first variant, shown in the right-hand part of FIG. 7, using mask 50 a first etching of the conductor or semiconductor layer 34 is carried out over a height of approximately 0.6 μm. This etching can be carried out anisotropically, e.g., using a reactive ion etching process with sulphur hexafluoride as the etching medium, when said layer is made from polycrystalline silicon. The end of etching can be checked by any known means.

In a second variant, shown in the left-hand part of FIG. 7 and corresponding to the use of a thinner conductor or semiconductor layer 34 successively covered with an insulating layer 36 and a conductor or semiconductor temporary layer 38, using gate negative mask 50, temporary layer 38 is etched so as to eliminate therefrom the regions not covered by mask 50 and expose the underlying regions of insulating layer 36. Said etching can be carried out by reactive ion etching using sulphur hexafluoride as the etching medium for a polycrystalline silicon layer 38.

This mask can optionally be used for defining, besides those of the gate and the gate connections, the dimensions of the short distance connections to be produced between the activity zones, i.e., source and/or drain of the transistor of the integrated circuit with the activity zones, i.e., a source and/or drain or another transistor of the same circuit. For example, mask 50a as shown in FIG. 7a, can be provided with an opening 53, whose dimensions correspond to those of a connection to be produced, e.g., a connection of the transistor drain. Opening 53 projects slightly above the region of the transistor to be produced in order to take account of positioning tolerances between mask 50a and mask 40 (FIG. 3).

After etching conductor or semiconductor layer 34 (right-hand part of the drawing) or semiconductor or conductor temporary layer 38 (left-hand part of the drawing), etching takes place in field oxide 46a using mask 50 or 50a over a height of approximately 0.6 μm. This etching can be carried out anisotropically by a reactive ion etching process using trifluoromethane as the etching agent.

Figure 8:
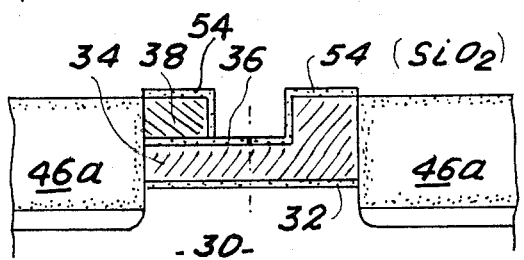

After eliminating mask 50 or 50a, which is particularly made from resin using an oxygen plasma, the structure can optionally be covered, as shown in FIG. 8, with a layer 54, called the edge insulating material layer made of an insulating material, e.g., silicon dioxide. In the case of a layer 34 (right-hand part of the drawing) or a temporary layer 38 (left-hand part of the drawing) made from polycrystalline silicon or silicide, the edge insulating material layer 54 can be obtained by thermal oxidation at a temperature of approximately 900° C. of the silicon or silicide. The edge insulating material layer 54 has a thickness of approximately 0.1 μm.

Figure 9:
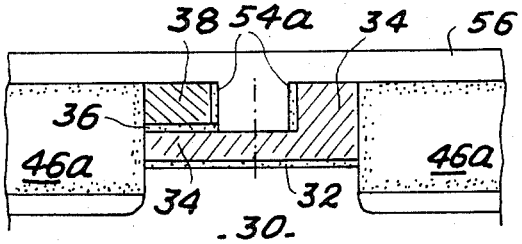

This is followed by an etching of the edge insulating material layer 54 so that, as shown in FIG. 9, all that is left thereof are the vertical strips 54a on the etched edges of the semiconductor or conductor layer 34 or 38, as a function of the variant used, the horizontal regions of said layer being eliminated. Moreover, said etching of the edge insulating material layer 54 makes it possible to eliminate the exposed regions of insulating layer 36 during the etching of temporary layer 38 by using the mask 50 or 50a defining the dimensions of the transistor gate, in the case of the process variant using the two layers 36 and 38. Said etching can be carried out anisotropically by a reactive ion etching process using trifluoromethane as the etching medium in the case of a silicon dioxide edge layer material 54.

The production of the transistor gate continues by depositing on the complete structure a planation material layer 56, called the planation/gate mask layer used for obliterating the structure relief. Layer 56 is preferably of polyimide. Following the deposition of said polyimide layer, the latter can undergo a heat treatment, such as heating at a temperature of approximately 400° C. for 30 minutes, so as to obtain a good spreading of layer 56, as well as a planar surface and a good hardening (crosslinking) of the polyimide.

Figure 10:
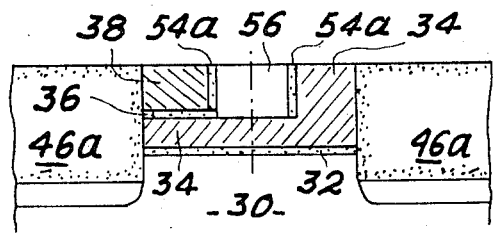

Finally, the planation/gate mask layer 56, preferably of polyimide, is etched so as to only leave those parts filling the hollowed out regions of the structure so that, following the etching of layer 56, a perfectly planar structure is obtained, in the manner shown in FIG. 10.

The hollowed out parts correspond to the etched region of layer 34 or 38 and optionally that of field oxide 46a (FIG. 7a), on defining the short distance connections of the integrated circuit at the same time as those of the transistor gate. When the planation/gate mask layer 56 is of polyimide, the etching thereof can be effected by reactive ion etching using oxygen as the etching medium.

Figure 11:
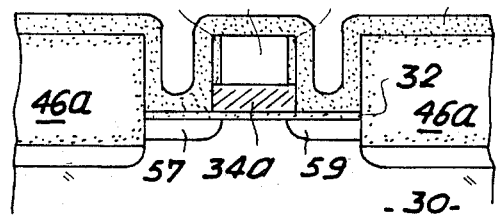

In the case of a thick conductor or semiconductor layer 34 this is followed, in the manner shown in the right-hand part of FIG. 11, by an etching of said layer, so as to eliminate the regions thereof not covered with the remaining planation/gate material layer 56. This etching is carried out so as to expose the underlying first layer 32 of insulating material. It can be carried out by an anisotropic etching process and particularly by a reactive ion etching process using sulphur hexafluoride as the etching medium, when layer 34 is of polycrystalline silicon.

In the variant of a thin conductor or semiconductor layer 34 covered with an insulating layer 36 and a conductor or semiconductor layer 38, in the manner shown in the left-hand part of FIG. 11, what is left of temporary layer 38 is eliminated, followed by the etching of insulating layer 36 and the conductor or semiconductor layer 34 until the first layer 32 of insulating material is exposed, etched planation/gate mask layer 56 serving as a mask for said etching process. These etching processes are performed using the remainder of planation/gate mask layer 56 as a mask.

Preferably, these etching processes are carried out anisotropically by reactive ion etching using sulphur hexafluoride as the etching agent for conductive layers 38, 34 made from polycrystalline silicon and tetrafluoromethane for insulating layer 36 made from silicon dioxide. As hereinbefore, the change of the etching product for the etching processes makes it possible to use the layer below that being etched as the etching barrier layer, so that the inhomogeneities of the different layers are compensated.

The use of an insulating layer 36 placed between two conductor or semiconductor layers 34, 38 makes it possible to improve and facilitate the different etching processes of said layers compared with the use of a single thick layer 34 and consequently facilitates the production of the transistor gate 34a.

The following stage of the first process for the production of an integrated circuit according to the invention consists of producing the source and drain of the N channel MOS transistor of said circuit. Source 57 and drain 59 are obtained by doping substrate 30 having a conductivity of the reverse type as compared with that of the substrate. For example, in the case of a type p silicon substrate, the doping can be effected by ion implantation by implanting arsenic ions, particularly at a dose of $5.10^{15}$ atm/cm$^2$ with an energy of 100 keV. This ion implantation is carried out through the first layer 32 of insulating material which is particularly of silicon dioxide and forms the gate oxide.

The following stages of the first production process according to the invention relate to producing insulating edges on the edges of the gate 34a of the MOS transistor of said circuit.

For this purpose, layer 58 called the insulating strip material layer of an insulating material, particularly of silicon dioxide is deposited on the complete structure.

This insulating strip material layer 58, which, e.g., has a thickness of 0.3 μm, is isotropically deposited, e.g., by means of a plasma-assisted low pressure vapor phase chemical deposition process (PECVD) at a low temperature of e.g., close to 350° C.

In the manner shown in FIG. 12, this is followed by the etching of said insulating strip material layer 58, so as to only leave the insulating strips 58a on the etched edges of the structure. The latter are in particular the edges of gate 34a, the insulating edges 54a and the edges of the field oxide 46a. The insulating strips 58a can advantageously be produced by anisotropically etching layer 58, more particularly using a reactive ion etching process. Thus, this type of etching makes it possible to obtain insulating strips 58a, whereof the width is defined by the thickness of the isotropically deposited insulating strip material layer 58. In particular, a 0.3 μm thick layer 58 makes it possible to obtain 0.3 μm wide insulating strips 58a. In the case of a silicon dioxide layer 58, the latter can be etched by using trifluoromethane as the etching agent.

The etching of insulating strip material layer 58 also makes it possible to eliminate those regions of the first layer 32 of insulating material positioned above source 57 and drain 59 of the transistor, as shown in FIG. 12.

The aforementioned formation of insulating strips 54a surmounting the transistor gate 34a makes it possible to improve the behaviour of the remainder of the more particularly resin planation/gate mask layer 56 and consequently the profile of insulating strips 58a.

As shown in FIG. 13, the following stage of the first process according to the invention consists of producing on the complete structure a negative mask 60 called contact holes negative mask, particularly of resin, representing the image of the short distance connections between the activity zones, i.e., source 57 and/or drain 59 of the integrated circuit transistor with the activity zones, i.e., a source and/or drain of another transistor of the same integrated circuit, in the case where the dimensions of the connections to be produced were not defined at the same time as those of the transistor gate and those of the connections of said gate (FIG. 7a). In other words, mask 60 makes it possible to define the dimensions of these connections. In the case shown in FIG. 13, mask 60 makes it possible, through its opening 61 projecting above drain 59, to define the dimensions of a connection of said drain to be produced.

Using mask 60, this is followed (FIG. 14) by the etching of field oxide 46a over a height of 0.6 μm, as well as an etching of insulating strips 58a not covered by mask 60 and in this particular case only the insulating strip located in the opening 61. The insulating strips are etched at roughly the same speed as the field oxide 46a. Following said etching, all that is left is a portion A of strip 58a located in the opening 61 of mask 60, whose height is equal to that of the level difference between drain 59 and the bottom of the etching of field oxide 46a. The etching of insulating layer 46a, in which is formed the field oxide, and the etching of the silicon dioxide insulating strips 58a preferably take place anisotropically using a reactive ion etching process, with trifluoromethane as the etching agent.

When the dimensions of the connections of the short distance transistor of the sources and drains to be produced have been defined at the same time as those of the gate of the latter and the connections of said gate (FIG. 7a), use is then made of a more particularly resin negative mask 60a also called a contact holes negative mask, as shown in FIG. 13a, then representing solely the image of the electrical contacts to be produced of the transistor activity zones, i.e., source 57 and/or drain 59. Using said mask 60a defining the dimensions of these contacts and in the present case only those of the contact of drain 59, the insulating strips 58a on either side of the connections to be produced are eliminated and in the particular case only the strips 58a located on the side of drain 59, whilst retaining those located on either side of the transistor gate 34a. This elimination can, e.g., be carried out by chemical etching, e.g., using hydrofluoric acid when the insulating strips are made from silicon dioxide.

In FIG. 13a, element B corresponds to a residue of layer 34 resulting from the etching of part of said layer during the etching of field oxide 46a (FIG. 7a).

Figure 14:
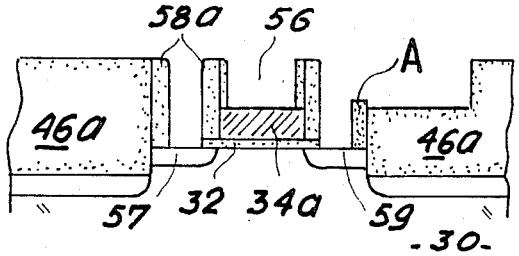

The first stage of the first process consists, as shown in FIG. 14, of eliminating mask 60 or mask 60a, particularly by using an oxygen plasma and then eliminating the remainder of the more particularly resin planation/gate mask layer 56 in the same stage.

Following the elimination of mask 60 or 60a and the remainder of planation/gate mask layer 56, a further doping is advantageously carried out in the transistor source 57 and drain 59, said doping having a conductivity of the reverse type compared with that of substrate 30. This doping, which is more particularly carried out by ion implantation makes it possible to obtain at the transistor gate 34a a double source-drain junction, which makes it possible to reduce the electric field between the transistor drain and gate. In the case of a type p substrate, said doping can be carried out by implanting arsenic ions with an energy of 130 keV and a dose of $5.10^{15}$ atm/cm$^2$.

The following stage of the process consists of annealing the complete structure obtained, so as to make electrically active the implanted ions, particularly during the production of the transistor source 57 and drain 59, whilst also rearranging the crystal lattice of the substrate, which was disturbed during the implantation. Annealing can be carried out in an oven at a temperature of approximately 900° C. for approximately 30 minutes.

The following stage of the process consists of eliminating the silicon dioxide, which may have formed during the elimination of mask 60 and the remainder of planation/gate mask layer 56, bearing in mind the etching agent used, i.e., the oxygen plasma when mask 60 and layer 56 are made from resin. This elimination can be obtained by a reactive ion etching process using a mixture of trifluoromethane and oxygen with a 5% by volume oxygen concentration.

The following stages of the first process relate to the formation of the electrical contacts and short distance connections of the integrated circuit, i.e. the connections between the sources and/or drains of the circuit transistors.

Figure 15:
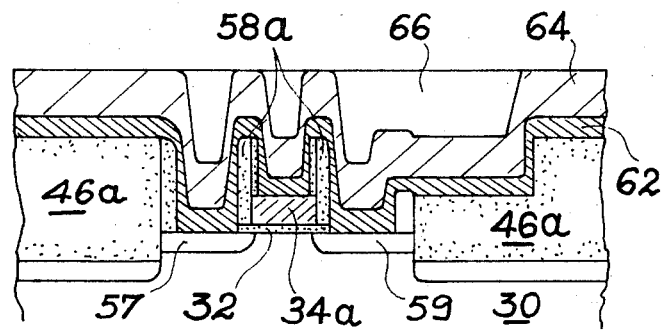

In the manner shown in FIG. 15, there is firstly a deposition of a layer 62 of a conductor or semiconductor material (eleventh material), followed optionally by the deposition of a layer 64 of another conductor or semiconductor material. Layer 62 acts as a diffusion barrier for layer 64, so as to ensure that the latter does not react with substrate 30 or gate 34a. Layer 62, e.g., has a thickness of 0.1 μm and layer 64 a thickness of 0.3 μm. These layers can be made from any material generally used in the production of integrated circuits. In particular they can be made from silicide or a refractory metal (molybdenum, platinum, tantalum, tungsten and titanium), but can also be made from other less usual materials such as copper, silver, aluminum, etc.

Preferably, layer 62 is made from a titanium-tungsten alloy and layer 64 from aluminum. The deposition of layer 62 and also layer 64 can be carried out by a magnetron sputtering process.

Layers 62 and 64 will also be used for producing the shunt resistor of the transistor gate 34a. Through producing layers 62, 64 respectively of a titanium-tungsten alloy and aluminum, it is possible to obtain a ten times lower shunt resistance than in the prior art processes, which makes it possible to increase the operating speed of the transistor and therefore the integrated circuit.

This is followed by the deposition of planation/contact covering layer 66 on conductor or semiconductor layer 64, so that the relief of the latter is obliterated. Preferably, planation/contact covering layer 66 is made from resin, like those currently used in photolithography. Following its deposition, resin layer 66 can undergo a heat treatment, e.g., baking at approximately 200° C., so as to obtain a good spread thereof and consequently a planar surface.

This is followed by the etching of planation/contact covering layer 66, so as to only retain the hollowed out portions of the relief. Following the etching of layer 66, the resulting structure then has a planar surface, as shown in FIG. 15. Said etching is preferably carried out by a reactive ion etching process using oxygen as the etching agent when layer 66 is made from resin.

Figure 16:
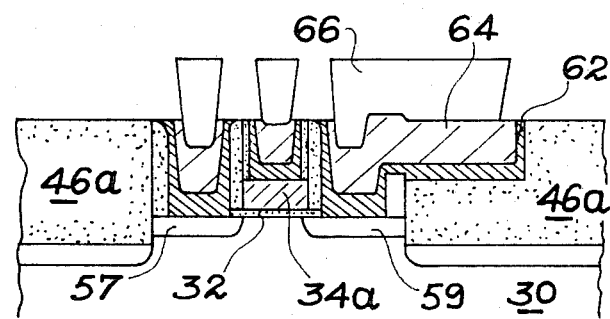
Figure 17:
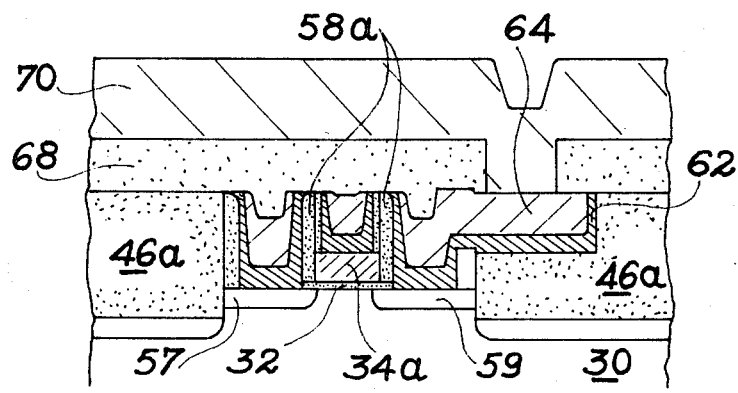

The following stage of the first process consists, as shown in FIG. 16, eliminating the regions of layer 64 and then those of layer 62 not covered with the remainder of planation/contact covering layer 66. This elimination can be carried out by anisotropic etching, such as reactive ion etching using carbon tetrafluoride as the etching agent for an aluminum layer 64 and sulphur hexafluoride for a titanium-tungsten alloy layer 62. This is followed by the elimination of the remainder of layer 66, e.g., using an oxygen plasma. The structure obtained is shown in FIG. 17.

The preceding stages, relating to the definition and production of electrical contacts and short distance connections of the integrated circuit, permit an autopositioning or self-alignment of the transistor source and drain contacts with respect to the transistor gate. Moreover, they make it possible to considerably increase the integration density of integrated circuits compared with the prior art, by eliminating the more particularly silicon dioxide insulating material layer in which are formed the electrical contact holes of the sources, drains and gates of the components by etching said layer (layer 14 in FIG. 1).

The following stages of the first process consist of producing the long distance connections between the different components of the integrated circuit. These connections are produced in a conventional manner, as shown in FIG. 17, by depositing an insulating layer 68, particularly of silicon dioxide, by forming the different electric contact holes in said insulating layer, by depositing a conductive layer 70, particularly of aluminum on the complete structure and by etching said layer with an appropriate mask so as to form the different connections.

The electric contact holes are preferably produced above the field oxide regions 46a, so as to have a single hole depth.

In view of the quasi-planarity of the structure obtained by the integrated circuit production process according to the invention (FIG. 17), the production of these long distance connections is greatly facilitated compared with the prior art processes.

FIGS. 18 to 20 diagrammatically show in longitudinal section the different stages of a second process for producing an integrated circuit according to the invention. As hereinbefore, the following description relates to the production of a MOS integrated circuit having a single N channel transistor, so as to simplify the description.

As the material layers have the same function as those described for the first production process, they carry the same references to which 100 has been added.

The first stage of this second process, illustrated by FIG. 18, consists of carrying out, in a semiconductor substrate 130, particularly of type p monocrystalline silicon, a preliminary doping with a conductivity of the same type as that of the substrate. This preliminary doping makes it possible to simultaneously define the doping beneath the transistor channel, as well as the doping of the field oxide of the integrated circuit to be produced. Such a doping system is described in an article in IEEE Transaction on Electron Devices, vol. ED 29, No. 4, April 1982, by K. L. WANG et al, entitled "Direct Moat Isolation for VLSI".

Preferably, this preliminary doping is carried out by ion implantation by implanting boron ions, in the case of a p substrate, and a dose of $5.3 \cdot 10^{11}$ atm/cm$^2$ with an energy of 80 keV, followed by another implantation with a dose of $3.2 \cdot 10^{11}$ atm/cm$^2$ with an energy of 150 keV.

The following stage of this second process consists of covering the semiconductor substrate 130 with a layer of insulating material 146, preferably silicon dioxide, in which will subsequently be formed the field oxide of the integrated circuit. Layer 146 can be obtained by deposition and particularly by a low pressure vapor phase chemical deposition process (LPCVD) preferably with plasma assistance (PECVD). Insulating layer 146, e.g., has a thickness of 1 μm.

Using conventional photolithography processes, a more particularly resin negative mask 140 is formed on insulating layer 146. Negative mask 140 makes it possible to define the substrate region in which will subsequently be produced the N channel transistor of the integrated circuit.

As shown in FIG. 19, this is followed by the etching of the insulating layer 146, so as to eliminate therefrom those regions not covered with mask 140. This etching can be carried out anisotropically and particularly by a reactive ion etching process using trifluoromethane as the etching agent when layer 146 is made from silicon dioxide. The thus formed field oxide carries reference 146a. The following stage of the second process consists of eliminating the resin mask 140, particularly using an oxygen plasma.

This is followed by the covering of the exposed substrate regions with an insulating material and more particularly silicon dioxide layer 132. Layer 132 can, e.g., be obtained by thermal oxidation of the substrate at a temperature of approximately 900° C. Layer 132 has a thickness of 0.025 μm. The oxide layer 132 will subsequently form the transistor gate oxide.

A layer 134 of a conductor or semiconductor material is then deposited on the complete structure and the transistor gate will be subsequently formed therein. Layer 134 is deposited by a vapor phase chemical deposition process. Layer 134, e.g., has a thickness of 1.2 μm and can be made with phosphorus-doped or non-phosphorus-doped polycrystalline silicon, silicide or a refractory metal, such as molybdenum, tantalum, titanium and tungsten.

The following stage of the second process consists of etching layer 134, so as to expose the field oxide 146a. As shown in FIG. 19, this can be carried out by depositing on the conductor or semiconductor layer 134, a layer 149 of a planation material for obliterating the relief of layer 134. Layer 149 is preferably made from resin, such as that currently used in photolithography. Following its deposition, layer 149 can undergo a heat treatment permitting a good spreading thereof.

This is followed by the simultaneous etching of conductor or semiconductor layer 134 and, planation layer 149 at identical etching speeds for the two layers. In the case of a polycrystalline silicon layer 134 and a resin layer 149, said etching can be carried out by reactive ion etching using as the etching agent sulphur hexafluoride and oxygen, the sulphur hexafluoride being used to etch the polycrystalline silicon and the oxygen to etch the resin.

The structure obtained after etching the conductor or semiconductor layer 134 is shown in FIG. 20.

The following stages of the second process consist of producing, as hereinbefore, the transistor gate (FIGS. 6 to 11), the transistor source and drain (FIG. 12), as well as the different contacts and electrical connections of said circuit (FIGS. 13 to 17).

It should be noted that this second process is a little more critical than the first process, particularly due to the absence of insulating temporary layer 36, serving as a barrier layer for the etching processes of the conductor or semiconductor layer 38 and the need to carry out the doping of the field oxide and the transistor channel at the same time and in an identical manner.

The two processes for producing an integrated circuit described hereinbefore involves several stages linked up in very different ways from those of the presently known processes. These two processes make it possible to obtain an integrated circuit, like that shown in cross-section in FIG. 21.

This integrated circuit has a gate 34a surrounded by the field oxide 46a of the integrated circuit and not extending over said field oxide, i.e., above the electrical insulations of the circuit. The layer 32 forms, as hereinbefore, the gate oxide and layers 62 and 64 form the conducting lines defining the shunt resistance of the gate, as well as the connections of gate 34a. Preferably, layer 62 is made from a titanium-tungsten alloy and layer 64 from aluminum, which gives the shunt resistance a ten times lower value than in prior art, bearing in mind the good electrical properties of these materials.

The fact that gate 34a does not extend above the integrated circuit field oxide 46a means that the circuit has a quasi-planar structure, which significantly facilitates the production of the connections of said transistor to the other components of the integrated circuit.

The embodiments of the processes according to the invention described hereinbefore have been given in exemplified manner and certain modifications to the different stages of these processes can be made without passing beyond the scope of the invention.

In particular, the elimination of the more particularly resin planation/gate mask layer 56 could be carried out prior to the deposition of insulating strip material layer 58 for producing the etched edges 58a (FIGS. 11 and 12). In the same way, the etching of the field oxide 46a (FIG. 7a) during the definition of the dimensions of the transistor connections at the same time as those of the transistor gate can be carried out prior to etching the conductive layer 38 or 34.

Furthermore, the annealing used for making the implanted ions electrically active in order to define the source 57 and drain 59 of the transistor can be carried out just after said implantation and particularly when said implantation is not to be followed by other implantations.

Moreover, the different material layers used in the processes according to the invention can be obtained in a manner other than that described. In particular, for insulating layers above a conductor or semiconductor layer more particularly made from polycrystalline silicon, said layers can be obtained by thermal oxidation of the substrate, when they are obtained by deposition and conversely can be obtained by deposition when obtained by oxidation.

Moreover, the deposition of the oxide layer 46 in which the field oxide 46a will be formed can be preceded by a thermal oxidation in order to ensure a good interface with the silicon forming the substrate, as well as layers 34 or 38.

In the same way, the etching of the different layers used in the processes according to the invention and carried out anisotropically, can be performed by using isotropic etching processes, such as vapor phase or liquid phase chemical etching processes, or ion machining or sputtering and vice versa. The two latter etching methods can be advantageously used when the materials constituting the different layers are difficult to etch, which is particularly the case when the conductive layers are made from copper, silver, etc. Finally, the thickness of the different layers can be changed.

The different stages of the processes according to the invention have the advantage of being simple to perform and are not critical. These processes consisting of a different approach from that of the generally used integrated circuit production processes are reliable and reproducible, which has not always been the case with the prior art processes.

I claim:

1. Process for the production, on a semiconductor substrate, of an integrated circuit having reciprocally electrically insulated active components in which gates of said components do not extend above electrical insulations used for the reciprocal insulation of said components, said process comprising, in sequence, the following steps:
    (a) covering said semiconductor substrate with a first layer of insulating material in which gate insulatings will be formed,
    (b) depositing on the first layer of insulating material a second layer including a semiconductor or conductor material in which will be formed said gates of said active components,
    (c) forming a field oxide of the circuit used for electrically insulating said active components from one another,
    (d) producing said gates of said active components in said second layer,
    (e) producing active zones of said components by a doping of the substrate, said doping having an opposite conductivity to that of the substrate,
    (f) forming insulating edges on the edges of said gates of said components,
    (g) producing electrical contact holes of the circuit, and
    (h) producing connections of the circuit.

2. Production process according to claim 1, wherein step (c) comprises the following successive steps:
    (1) defining the regions of said substrae in which will be produced said active components with the aid of a first positive mask,
    (2) eliminating the regions of said first and second layers surmounting the substrate, and free from said first positive mask, so as to expose regions of said substrate masked by said first positive mask,
    (3) preliminarily doping said semiconductor substrate in the exposed regions thereof, said preliminary doping having the same type of conductivity as that of said semiconductor substrate and occurring prior to the doping of step (e),
    (4) eliminating said first positive mask,
    (5) depositing a third layer of an insulating material on the complete structure obtained, and
    (6) anisotropically etching said third layer, so as to expose the upper surface of said etched second layer located directly below said third layer.

3. Production process according to claim 2, comprising:
    following step (5), on said third layer of insulating material, depositing a fourth layer of material obliterating the relief of said third layer of insulating material and performing step (6) by simultaneously etching said third and fourth layers of materials at identical etching speeds.

4. Production process according to claim 3, wherein anisotropic etching of said fourth material layer takes place.

5. Production process according to claim 2, comprising:
    following step (2), partially etching the substrate regions exposed with the aid of said first positive mask.

6. Production process according to claim 2, comprising performing step (2) by successively anisotropically etching said first and second layers of material surmounting said substrate.

7. Production process according to claim 1, wherein step (b) comprises depositing a semiconductor or conductor material on said first layer, covering said semiconductor or conductor material with an insulating layer of insulating material, and depositing on said insulating layer of insulating material a temporary layer of material different from said insulating material of said insulating layer.

8. Production process according to claim 7, wherein step (d) comprises the following successive steps:
    (1) defining the dimensions of said gates of said components and electrical connections of these gates to be produced by means of a gate negative mask,
    (2) eliminating the regions of said temporary layer free from said gate negative mask until the exposure of said insulating material layer,
    (3) partially etching said field oxide with the aid of said gate negative mask,
    (4) eliminating said gate negative mask,
    (5) depositing on the complete structure obtained a planation/gate mask layer obliterating the relief of said structure,
    (6) etching the planation/gate mask layer, so as to only retain the material of said planation/gate mask layer in the hollowed out parts of the relief, the structure resulting from said etching then having a planar surface, (7) eliminating the remaining temporary layer, and (8) etching said insulating layer of insulating material and said semiconductor or conductor material until said first layer of insulating material is exposed, the etched planation/gate mask layer acting as a mask for said etching.

9. Production process according to claim 8, comprising:

between steps (4) and (5), covering the structure with an edge insulating layer and then etching said edge insulating layer so as to only leave said edge insulating layer on the etched edges of said temporary layer.

10. Production process according to claim 8, wherein anisotropic etching of said planation/gate mask layer takes place.

11. Production process according to claim 7, wherein step (d) comprises the following successive steps:

(1) defining the dimensions of said gates of said components and electrical connections of these gates to be produced by means of a gate negative mask, (2) eliminating the regions of said temporary layer free from said gate negative mask until the exposure of said insulating material layer, (3) eliminating said gate negative mask, (4) depositing on the complete structure obtained a planation/gate mask layer obliterating the relief of said structure, (5) etching the planation/gate mask layer, so as to only retain the material of said planation/gate mask layer in the hollowed out parts of the relief, the structure resulting from said etching then having a planar surface, (6) eliminating the remaining temporary layer, and (7) etching said insulating layer of insulating material and said semiconductor or conductor material until said first layer of insulating material is exposed, the etched planation/gate mask layer acting as a mask for said etching.

12. Production process according to claim 11, comprising:

between steps (3) and (4), covering the structure with an edge insulating layer and then etching said edge insulating layer so as to only leave said edge insulating layer on the etched edges of said temporary layer.

13. Production process according to claim 11, wherein anisotropic etching of said planation/gate mask layer takes place.

14. Production process according to claim 1, wherein said gates of said components are produced by performing the following successive steps:

(1) defining the dimensions of said gates of said components and the electrical connections of said gates to be produced by means of a gate negative mask, (2) using said gate negative mask, producing a first etching of said second layer over a predetermined height, (3) partially etching said field oxide with the aid of said gate negative mask, (4) eliminating said gate negative mask, (5) depositing on the complete structure obtained a planation/gate mask layer of a material obliterating the relief of said structure, (6) etching said planation/gate mask layer, so that all that is retained thereof are the hollowed out portions, the resulting structure then having a planar surface, and (7) carrying out a second etching of said second layer until said first layer of insulating material is exposed, the etched planation/gate mask layer serving as a mask for said etching.

15. Production process according to claim 14, comprising:

between steps (4) and (5), covering the structure with an edge insulating layer of insulating material, which is then etched so as to only leave said edge insulating layer on the etched edges of said second layer obtained during said first etching of said second layer.

16. Production process according to claim 14, wherein definition of the dimensions of the connections to be produced between said acitve zones of said components takes place during the definition of the dimensions of said gates of said components by means of said gate negative mask and said field oxide is partially etched using said gate negative mask.

17. Production process according to claim 14, wherein anisotropic etching of said planation/gate mask layer takes place.

18. Production process according to claim 1, wherein said gates of said components are produced by performing the following successive steps:

(1) defining the dimensions of said gates of said components and the electrical connections of said gates to be produced by means of a gate negative mask, (2) using said gate negative mask, producing a first etching of said second layer over a predetermined height, (3) eliminating said gate negative mask, (4) depositing on the complete structure obtained a planation/gate mask layer of a material obliterating the relief of said structure, (5) etching said planation/gate mask layer, so that all that is retained thereof are the hollowed out portions, the resulting structure then having a planar surface, and (6) carrying out a second etching of said second layer until said first layer of insulating material is exposed, the etched planation/gate mask layer serving as a mask for said etching.

19. Production process according to claim 18, comprising:

between steps (3) and (4), covering the structure with an edge insulating layer of insulating material, which is then etched so as to only leave said edge insulating layer on the etched edges of said second layer obtained during said first etching of said second layer.

20. Production process according to claim 18, wherein definition of the dimensions of the connections to be produced between said active zones of said components takes place during the definition of the dimensions of said gates of said components by means of said gate negative mask and said field oxide is partially etched using said gate negative mask.

21. Production process according to claim 18, wherein anisotropic etching of said planation/gate mask layer takes place.

22. Production process according to claim 1, wherein said insulating edges are formed on the edges of said gates of said components by performing the following successive steps:

(1) depositing on the complete structure an insulating strip material layer,
(2) etching said insulating strip material layer so as to only leave said insulating strip material layer on the etched edges of the structure, thus forming strips of said insulating strip material layer,
(3) producing a contact holes negative mask on the structure obtained in order to define the dimensions of the electrical contacts of said active zones of said components to be produced,
(4) etching of said insulating strips not covered by said contact holes negative mask over all or part of their height, and
(5) eliminating said contact holes negative mask.

23. Production process according to claim 22, wherein definition of the dimensions of the connections to be produced between said active zones of said components takes place during the definition of the dimensions of the electrical contacts of said active zones of said components by means of said contact holes negative mask and said field oxide is partially etched using said contact holes negative mark.

24. Production process according to claim 22, wherein anisotropic etching of said insulating strip material layer takes place.

25. Production process according to claim 1, wherein the electrical connections and connections of the circuit are obtained by carrying out in step (g) the following successive steps:
(1) depositing on the complete structure at least one conductive layer of a conductive material in which the connections will be formed,
(2) depositing on said conductive layer a planation/-contact covering layer obliterating the relief of said conductive layer,
(3) etching the planation/contact covering layer, so as to only leave it in the hollowed out portions of said relief, the structure resulting from said etching then having a planar surface,
(4) eliminating the regions of the conductive layer not covered by the etched planation/contact covering layer, and
(5) eliminating the remainder of said planation/contact covering layer.

26. Production process according to claim 25, wherein two conductive layers are deposited on top of one another to form said connections.

27. Production process according to claim 25, wherein anisotropic etching of said field oxide and said planation/contact covering layer takes place.

28. Production process according to claim 1, wherein said second layer includes a material selected from the group consisting of polycrystalline silicon, molybdenum, tantalum, titanium and tungsten.

29. Production process according to claim 1, wherein said second layer includes a material selected from the group consisting of molybdenum silicide, tantalum silicide, titanium silicide and tungsten silicide.

30. Process for the production, on a semiconductor substrate, of an integrated circuit having active components which are electrically insulated from one another in which gates of said components do not extend above electrical insulations used for insulating said components from one another, comprising, in sequence, the following steps:
(a) producing a field oxide of the circuit used for electrically insulating said active components from one another,
(b) covering said semiconductor substrate and said field oxide with a first layer of an insulating material in which will be formed gate insulatings,
(c) depositing on the complete structure a second layer of a semiconductor or conductor material in which will be formed said gates of said active components,
(d) etching said second layer of semiconductor or conductor material so as to expose said field oxide,
(e) producing said gates of said active components in said second layer,
(f) producing active zones of said components by a doping of said semiconductor substrate, said doping having an opposite conductivity to that of said semiconductor substrate,
(g) producing insulating edges on the edges of said gates of the components,
(h) producing electrical contact holes of the circuit, and
(i) producing connections of the circuit.

31. Production process according to claim 30, wherein (a) comprises the following successive steps:
carrying out a preliminary doping of the whole of said semiconductor substrate having a conductivity of the same type as that of said semiconductor substrate wherein said preliminary doping occurs before the doping of step (f),
depositing a field oxide layer of insulating material on the complete semiconductor substrate,
defining the regions of the substrate in which will be formed the active components with the aid of a first negative mask,
eliminating the regions of said field oxide layer of material free from said first negative mask, and
eliminating said first negative mask.

32. Production process according to claim 30, comprising:
after step (c), depositing on said second layer of semiconductor or conductor material a planation layer obliterating the relief of said second layer of semiconductor or conductor material and performing step (d) by simultaneously etching said second layer and said planation layer at identical etching speeds.

33. Production process according to claim 32, wherein anisotropic etching of said planation layer takes place.

34. Production process according to claim 30, wherein said gates of said components are produced in step (e) by performing the following successive steps:
(1) defining the dimensions of said gates of said components and the electrical connections of said gates to be produced by means of a gate negative mask,
(2) using said gate negative mask, producing a first etching of said second layer over a predetermined height,
(3) partially etching said field oxide with the aid of said gate negative mask,
(4) eliminating said gate negative mask,
(5) depositing on the complete structure obtained a planation/gate mask layer of a material obliterating the relief of said structure,
(6) etching said planation/gate mask layer, so that all that is retained thereof are the hollowed out portions, the resulting structure then having a planar surface, and
(7) carrying out a second etching of said second layer until said first layer of insulating material is exposed, the etched planation/gate mask layer serving as a mask for said etching.

35. Production process according to claim 34, comprising:
between steps (4) and (5), covering the structure with an edge insulating layer of insulating material, which is then etched so as to only leave said edge insulating layer on the etched edges of said second layer obtained during said first etching of said second layer.

36. Production process according to claim 34, wherein definition of the dimensions of the connections to be produced between said active zones of said components takes place during the definition of the dimensions of said gates of said components by means of said gate negative mask and said field oxide is partially etched using said gate negative mask.

37. Production process according to claim 34, wherein anisotropic etching of said field oxide and said planation/gate mask layer takes place.

38. Production process according to claim 30, wherein said gates of said components are produced in step (e) by performing the following successive steps:
(1) defining the dimensions of said gates of said components and the electrical connections of said gates to be produced by means of a gate negative mask,
(2) using said gate negative mask, producing a first etching of said second layer over a predetermined height,
(3) eliminating said gate negative mask,
(4) depositing on the complete structure obtained a planation/gate mask layer of a material obliterating the relief of said structure,
(5) etching said planation/gate mask layer so that all that is retained thereof are the hollowed out portions, the resulting structure then having a planar surface, and
(6) carrying out a second etching of said second layer until said first layer of insulating material is exposed, the etched planation/gate mask layer serving as a mask for said etching.

39. Production process according to claim 38, comprising:
between steps (3) and (4), covering the structure with an edge insulating layer of insulating material, which is then etched so as to only leave said edge insulating layer on the etched edges of said second layer obtained during said first etching of said second layer.

40. Production process according to claim 38, wherein definition of the dimensions of the connections to be produced between said active zones of said components takes place during the definition of the dimensions of said gates of said components by means of said gate negative mask and said field oxide is partially etched using said gate negative mask.

41. Production process according to claim 38, wherein anisotropic etching of said field oxide and said planation/gate mask layer takes place.

42. Production process according to claim 30, wherein said insulating edges are formed on the edges of said gates of said components by performing the following successive steps:
(1) depositing on the complete structure an insulating strip material layer,
(2) etching said insulating strip material layer so as to only leave said insulating strip material layer on the etched edges of the structure, thus forming strips of said insulating strip material layer,
(3) producing a contact holes negative mask on the structure obtained in order to define the dimensions of the electrical contacts of said active zones of said components to be produced,
(4) etching of said insulating strips not covered by said contact holes negative mask over all or part of their height, and
(5) eliminating said contact holes negative mask.

43. Production process according to claim 42, wherein anisotropic etching of said field oxide and said insulating strip material layer takes place.

44. Production process according to claim 42, wherein definition of the dimensions of the connections to be produced between said active zones of said components takes place during the definition of the dimensions of the electrical contacts of said active zones of said components by means of said contact holes negative mask and said field oxide is partially etched using said contact holes negative mask.

45. Production process according to claim 30, wherein the electrical connections and connections of the circuit are obtained by carrying out in step (h) the following successive steps:
(1) depositing on the complete structure at least one conductive layer of a conductive material in which the connections will be formed,
(2) depositing on said conductive layer a planation/contact covering layer obliterating the relief of said conductive layer,
(3) etching said planation/contact covering layer, so as to only leave it in the hollowed out portions of said relief, the structure resulting from said etching then having a planar surface,
(4) eliminating the regions of said conductive layer not covered by the etched planation/contact covering layer,
(5) eliminating the remainder of said planation/contact covering layer.

46. Production process according to claim 45, wherein two conductive layers are deposited on top of one another to form said connections.

47. Production process according to claim 45, wherein anisotropic etching of said field oxide and said planation/contact covering layer takes place.

48. Production process according to claim 30, wherein said second layer includes a material selected from the group consisting of polycrystalline silicon, molybdenum, tantalum, titanium and tungsten.

49. Production process according to claim 30, wherein said second layer includes a material selected from the group consisting of molybdenum silicide, tantalum silicide, titanium silicide and tungsten silicide.

* * * * *